United States Patent
Aimone et al.

(10) Patent No.: US 7,651,658 B2
(45) Date of Patent: Jan. 26, 2010

(54) REFRACTORY METAL AND ALLOY REFINING BY LASER FORMING AND MELTING

(75) Inventors: Paul R. Aimone, Bridgewater, MA (US); Prabhat Kumar, Framingham, MA (US); Peter R. Jepson, Newbury, MA (US)

(73) Assignee: H.C. Starck Inc., Newton, MA (US)

( * ) Notice: Subject to any disclaimer, the term of this patent is extended or adjusted under 35 U.S.C. 154(b) by 684 days.

(21) Appl. No.: 10/501,837

(22) PCT Filed: Jan. 22, 2003

(86) PCT No.: PCT/US03/01825
§ 371 (c)(1),
(2), (4) Date: Nov. 16, 2004

(87) PCT Pub. No.: WO03/062491
PCT Pub. Date: Jul. 31, 2003

(65) Prior Publication Data
US 2005/0142021 A1    Jun. 30, 2005

(51) Int. Cl.
*B22F 5/00* (2006.01)
*B23K 26/32* (2006.01)

(52) U.S. Cl. ............ 419/9; 219/121.66; 219/121.85; 427/554; 427/597

(58) Field of Classification Search ........... 419/7, 419/9, 47; 219/121.65, 121.66, 121.85; 427/544, 427/597
See application file for complete search history.

(56) References Cited

U.S. PATENT DOCUMENTS

| | | | | |
|---|---|---|---|---|
| 4,323,756 A | * | 4/1982 | Brown et al. | 219/121.66 |
| 5,038,014 A | * | 8/1991 | Pratt et al. | 219/121.64 |
| 5,208,431 A | * | 5/1993 | Uchiyama et al. | 219/121.65 |
| 5,640,667 A | * | 6/1997 | Freitag et al. | 419/31 |
| 6,046,426 A | * | 4/2000 | Jeantette et al. | 219/121.63 |
| 6,172,327 B1 | * | 1/2001 | Aleshin et al. | 219/121.64 |
| 6,203,861 B1 | * | 3/2001 | Kar et al. | 427/554 |
| 6,215,093 B1 | * | 4/2001 | Meiners et al. | 219/121.61 |
| 2002/0015654 A1 | * | 2/2002 | Das et al. | 419/8 |
| 2002/0112955 A1 | * | 8/2002 | Aimone et al. | 204/298.12 |

FOREIGN PATENT DOCUMENTS

DE    19925330    * 12/2000

OTHER PUBLICATIONS

Abbott D. H. et al: "Laser Forming Titanium Components" Advanced Materials & Processes, America Society for Metals. Metals Park, Ohio, US, vol. 153, No. 5, May 1998, pp. 29-30, XP001120282.
Arcella F.G. Froes R.H.: "Producing titanium aerospace components from powder using laser forming" JOM, Minerals, Metals & Materials Soc (TMS), Warrendale, PA, USA, May 2000, pp. 28-30, XP001157479.
Griffith M. L. et al: "Understanding the Microstructure and Properties of Components Fabricated By Laser Engineered Net Shaping (Lens)" Material Research Society Symposium Proceedings, Solid Freeform and Additive Fabrication—2000 Conf., San Francisco, CA, USA, vol. 625, Apr. 24-26, 2000, pp. 9-20, XP001157465.

* cited by examiner

*Primary Examiner*—Roy King
*Assistant Examiner*—Ngoclan T Mai
(74) *Attorney, Agent, or Firm*—Connolly Bove Lodge & Hutz LLP

(57) ABSTRACT

A process to chemically refine and consolidate tantalum, niobium and their alloys to a fabricated product of net shape or near-net shape with higher throughput, more consistency, and lower manufacturing costs compared to prior art routes or rejuvenate damaged and deteriorated refractory metal parts. Powder metal is loaded into hoppers to be fed into laser forming/melting equipment. A suitable substrate is loaded into a laser forming/melting chamber onto which the powder will be deposited and consolidated in a point-scan process. As the powder is fed onto successive points of the surface of the substrate in linear traces, the laser is used to heat and partially melt the substrate and completely melt the powder. A combined deposition and melt beam traces the substrate surface repeatedly over a selected area to build up a dense coating of controlled microstructure in multiple layers. A fully dense deposit is built up that becomes the desired shape.

13 Claims, 3 Drawing Sheets

(a) Powder Jets and Laser or EB Raster Scan
(b) Powder Deposits and Laser or EB Raster Scan

REFRACTORY METAL AND ALLOY REFINING BY LASER FORMING AND MELTING

BACKGROUND OF THE INVENTION

The present invention relates to fabrication and rejuvenation of refractory metal parts, and more particularly to fabrication and rejuvenation of refractory metal parts at net shape or near shape with controlled microstructure.

Current processes for producing high purity refractory metal parts, such as sheets made from tantalum and tantalum alloys (for usage as sputtering targets, tube perform is, furnace part performs, etc.), include powder and ingot metallurgy. The ingot metallurgy process begins with selecting and blending suitable powders, pressing into bars and sintering. An electron beam or plasma or arc furnace is used to melt the bar and cool it into an ingot. The melting can be done in multiple steps. Electron beam melting and remelting removes impurities to produce an essentially pure tantalum ingot. Purities of 99.9% tantalum are routinely achieved. The ingot is thermomechanically processed and further cold or hot worked as needed (or cold worked with intermediate annealing) to produce a desired shape, such as plate, sheet, rod or fabricated part (hemisphere, semi-hemisphere, conical, dished sheet, cup, box, etc.). Components may also be machined directly from ingots 3.

This overall process is relatively slow and results in a final yield of approximately 40 to 60 percent. The sintering process consumes a significant amount of furnace time, but it is required to provide sufficient mechanical strength in the bars and is a preliminary deoxidation step for the refractory metal powder, such as tantalum. The bars are usually electron beam-melted under a hard vacuum to remove chemical impurities. The electron beam melting process can also consume a significant amount of furnace time and power, such as three electron beam guns at 105 kilowatts for 8 to 16 hours. Remelting is usually required which also consumes significant furnace time and power, such as four electron beam guns at 150 kilowatts for 8 to 16 hours.

Laser additive manufacturing (LAM) is a direct deposition process that uses a high power laser and powder feeding system to produce complex three-dimensional components from metal powders. The high power laser and multi-axis positioning system work directly from a CAD file to build up the component using a suitable metal powder. This process is similar to conventional rapid prototyping techniques, such as stereolithography and selective laser sintering (SLS), and laser welding. Laser welding was developed to join two components or to fabricate an article integral to a component. However, a fully dense metal component can only be made with such additional steps as casting or HIP'ing (hot isostatic pressing). Such a laser process has been developed to manufacture near-net shape titanium components for the aerospace industry. But a process does not exist for still higher melting refractory metals, such as tantalum.

Additionally, sputtering targets of high temperature materials, such as tantalum and other refractory metals (Ta, Nb, Ti, Mo, Zr, metals and alloys; hydrides, nitrides and other compounds thereof) used in integrated circuit manufacture and other electrical, magnetic and optical product manufacture usually are eroded in a non-uniform way during the process of sputtering which leads to a race track like trench on the operating side of the target. In order to prevent any contamination of substrates or catastrophic break-through of coolant fluids behind the target, the targets generally are withdrawn from service well before the refractory sputter metal is penetrated, accepting the need for a new target after only a minor portion of the sputter metal has been consumed. The major part of the sputter target can be resold only at scrap price or recycled with difficulty and apart from this, the backing plate of the target needs to be removed and may be re-bonded to a new sputter metal plate for recycling.

Consequently, there is a need to rejuvenate the refractory metal of the sputtering target to eliminate the need to recycle the whole target after only a minor share of the tantalum plate has been consumed.

It is an object of the present invention to provide a laser processing method for refractory metals and their alloys that produces a fully dense deposit that can be planar or curved with macro- and micro-mechanical properties at least equivalent to traditionally melted, consolidated, rolled and annealed parts.

It is a further object to increase yield recovery and otherwise decrease fabrication time and costs by net-shape or near-net shape fabrication.

It is a further object of the invention to decrease the recycling cost of refractory metal parts, such as tantalum plates for sputtering targets including their backing plate.

It is yet another object of the invention to reduce the cycle time between removing the refractory metal part, such as a sputtering target, from service and getting it back to service will be shortened.

SUMMARY OF THE INVENTION

The invention relates to a process for making a refractory metal part comprising (a) loading powder metal particles into a hopper for feeding into a laser additive chamber, (b) loading a substrate into the laser additive chamber, (c) feeding the powder metal powders into the additive chamber onto successive points on the substrate in a linear trace, (d) melting the substrate and the powder with a laser beam and building up multiple coatings of a controlled microstructure, (e) tracing the substrate over a selected area with a combined deposition and melt beam and building up a coating of a controlled microstructure in multiple layers, and (f) building up a deposit from the coating and forming a refractory metal part.

The invention also relates to a method for rejuvenating a tantalum sputtering target comprising subjecting an eroded region of a tantalum sputtering target to plasma deposition, forming a fully dense coating, and thereby rejuvenating the tantalum sputtering target.

The invention also relates to a method for rejuvenating a tantalum sputtering target comprising subjecting an eroded region of a tantalum sputtering target to laser sintering, forming a fully dense coating, thereby rejuvenating the tantalum sputtering target.

The invention also relates to a method for rejuvenating a tantalum sputtering target comprising subjecting an eroded region of a sputtering target to hot isostatic pressing, forming a fully dense coating, and filling the eroded region of a tantalum sputtering target, thereby rejuvenating the tantalum sputtering target. Alternatively, the invention can also include products made from such processes.

As such, the present invention is a process and the resultant product. The process is one to chemically refine and consolidate refractory metals and their alloys to a fabricated product of net shape or near-net shape with higher throughput, more consistency, and lower manufacturing costs compared to prior art routes. Powder metal is loaded into hoppers to be fed into the LAM equipment. A suitable substrate is loaded into a LAM chamber onto which the powder will be deposited and consolidated in a point-scan process. As the powder is fed onto successive points of the surface of the substrate in linear traces, the laser is used to heat partially melt the substrate and partially or completely melt the powder. A combined deposition and melt beam traces the substrate surface repeatedly over a selected area to build up a dense coating of controlled microstructure in multiple layers. A fully dense deposit is built up that becomes the desired shape. This entire process is conducted in a chamber under inert conditions, such as argon, at, near or below atmospheric pressures but can also be conducted under a hard vacuum.

The relatively high heat or power input to the powder particles and the short diffusion distance results in purification of the powder and the resultant product. The process yields are 90 percent or more, requiring minimal machining to clean up deposit edges and product surfaces depending on final shape and end use application.

As used in the manufacture of sputtering targets, the process will yield the necessary grain purity and have a columnar grain structure to aid uniform sputtering characteristics.

For rejuvenation purposes, the race track trench on the face of the deteriorated tantalum sputtering target is filled by laser sintering, plasma deposition or HIP-bonding powder/plate material which will yield a fully dense coating. In the case of laser sintering or plasma deposition the target could be rejuvenated without debonding the backing plate from the target. In the case of HIP-bonding either low oxygen Ta powder or any Ta plate material could be used. Rejuvenation is an economic process if filling the trench by any of the proposed methods is cheaper than recycling the whole target. No debonding of the backing plate is needed. It can be reused as many times as desired.

Used sputtering targets can be processed to fill the race track trench or other erosion zone on the face of the target by a placement or deposition of sputter metal and sinter bonding by laser or EB heating for sintering, plasma discharge coupled with deposition or HIP-bonding powder/plate material. Use of these methods will yield a fully dense coating. This avoids the need for decoupling the tantalum from the copper, filling the erosion zone of the tantalum plate with tantalum powder and HIP bonding and reassembly. In the case of laser or EB scan sintering or plasma discharge coupled with deposition the target can be rejuvenated without separating the backing plate from the target.

The various forms of rejuvenation produce a filled erosion zone with microstructure similar to the balance of the target.

The rejuvenation of a refractory metal (e.g. tantalum) target eliminates the need to recycle the whole target after only a minor share of the sputter plate has been consumed. Such rejuvenation can be more economical than recycling the whole target. No separation of the bonded backing plate (e.g. copper) is needed.

This rejuvenation can be reused as many times as desired. Other objects, features and advantages will be apparent from the following detailed description of preferred embodiments taken in conjunction with the accompanying drawings in which:

DETAILED DESCRIPTION OF PREFERRED EMBODIMENTS

Figure 1:
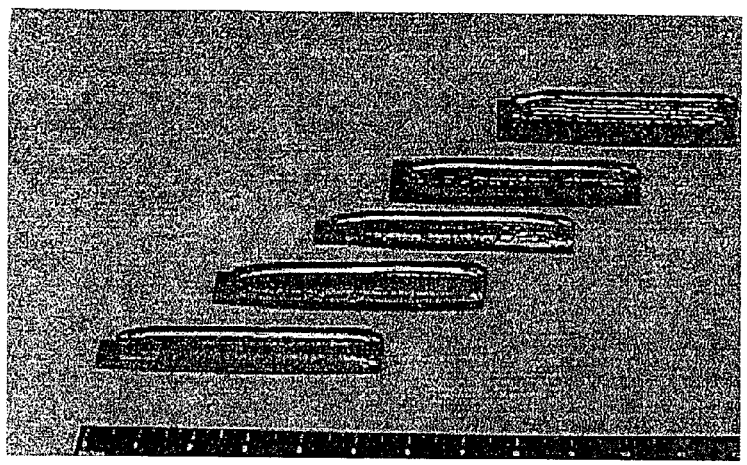
FIG. 1 shows the five deposits (products) formed from the preferred embodiments of the process of the invention.

An embodiment of the present invention is a laser process to produce high purity refractory metal and alloys formed from refractory metal powder. The tantalum powder (−120+325 mesh), and a tantalum plate substrate applied in a depositing apparatus as described in U.S. Pat. No. 6,269,536, incorporated herein by reference in its entirety). The laser energy was approximately 17 kW delivered. FIG. 1 shows the five deposits formed from the laser process. Each deposit is the result of approximately five to seven layers with each layer being approximately 0.010" thick.

The physical property differences described above also meant the deposition rates had to be much lower than for titanium. The higher melt temperature and thermal conductivity of tantalum compared to titanium meant the tantalum molten pool was probably smaller and a smaller quantity of powder could be melted by the available laser power.

Table 1 shows the results of the chemical analysis (GDMS) of the starting powder and the final deposits. In general there was very little change in the refractory metal content (example, Nb, and W) of the deposit as compared to the starting powder. With the exception of titanium and vanadium, there was a measurable reduction in the metallic contamination of the deposit. Titanium and vanadium contamination came from previous work in the test equipment conducted with Ti-6Al-4V alloy.

TABLE 1

| Element | Concentration (ppm) Powder | Concentration (ppm) Deposit | PPM Reduction Powder − Deposit |
|---|---|---|---|
| B | 0.18 | 0.04 | 0.14 |
| Mg | 35 | 0.21 | 34.79 |
| Al | 1.4 | 0.46 | 0.94 |
| Si | 30 | 4.2 | 25.80 |
| P | 1.1 | 0.1 | 1.00 |
| Ti | 0.9 | 30 | (−29.10) |
| V | 0.1 | 3.1 | (−3.00) |
| Cr | 3.8 | 1.4 | 2.40 |
| Mn | 0.8 | 0.07 | 0.73 |
| Fe | 50 | 4.5 | 45.50 |
| Co | 0.47 | 0.07 | 0.40 |
| Ni | 700 | 29 | 671.00 |
| Cu | 4.6 | 0.05 | 4.55 |
| Nb | 91 | 90 | 1.00 |
| Mo | 1.8 | 0.44 | 1.36 |
| W | 2.6 | 2.4 | 0.20 |
| % Ta | 99.908 | 99.983 | — |
| Total | 925 | 166 | 759 |

Figure 2:
FIG. 2 shows a typical metallographic section taken from each such deposit.

FIG. 2 shows a typical metallographic section taken from each deposit. No porosity was found in any of the sections examined except at the very outer surface of the deposit. The deposits examined had from two to five grains (grain boundaries are marked with arrows) across their width.

These grains grew from the original grains in the base plate. There was no evidence of any internal defects (i.e., cracks, inclusions, foreign particles, and the like) in the deposits.

Tables II and III show the mechanical test results. The Vicker's Hardness Numbers (VHN, 500 g) for three of the samples are slightly higher than might be expected for rolled and annealed tantalum sheet (VHN of approximately 100). These deposits have not been annealed and the VHN suggests the material is not brittle. The slightly higher hardness of sample 1 as compared to samples 2 and 3 is the result of its slightly higher oxygen content. Table III shows the room temperature yield and ultimate strengths of these three deposits meet the ASTM specifications for rolled and annealed tantalum sheet. The samples 1, 2, and 3 there are acceptable, notwithstanding the elongation values are slightly below specification minimums (note that sample 3 failed near the radius of the test bar, not in the center of the gage section, and was deemed a bad test).

TABLE II

Vicker Hardness Numbers, 500a

| Sample 1 | Sample 2 | Sample 3 |
|---|---|---|
| 121.7 | 114.0 | 109.8 |
| 120.0 | 106.6 | 109.2 |
| 125.4 | 107.4 | 110.7 |
| 125.0 | 106.6 | 108.3 |
| 124.3 | 106.6 | 111.6 |
| 123.2 | 111.5 | 110.7 |
| 121.1123.6 | 111.7 | 110.1 |
| 121.4 | 105.4 | 109.9 |
| 121.1 | 112.1 | 106.8 |
| 123.5 | 110.0 | 106.2 |
| Avg. 122.9 ± 1.8 | 109.2 ± 3.0 | 109.3 ± 1.7 |

TABLE III

Room Temperature Tensile Test Results

| Sample No. | Yield Strength (ksi) | Ultimate Tensile Strength (ksi) | Total Elongation |
|---|---|---|---|
| 1 | 29.7 | 31.7 | 24.1 |
| 2 | 25.9 | 31.5 | 23.5 |
| 3 | 26.4 | 30.0 | 12.7 |
| ASTM B365 (mins.) | 15.0 | 25.0 | 25.0 |

The results presented above show the laser formed tantalum deposits have chemical and mechanical properties equivalent to rolled and annealed tantalum sheet. The deposits were fully dense with no evidence of porosity except at the very outer surface of the deposit.

Figure 3:
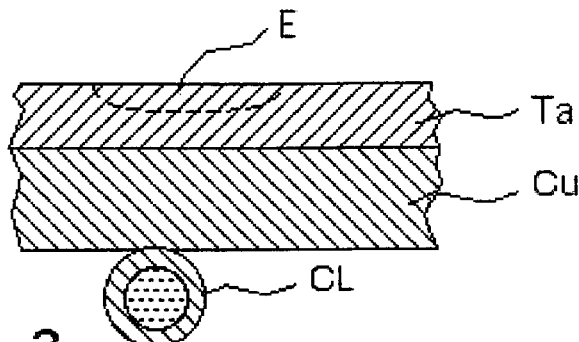
FIG. 3 shows a cross section of typical target and backing plate.
Figure 4:
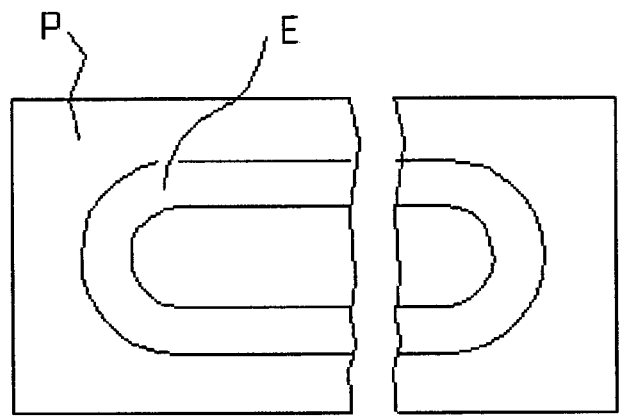
FIG. 4 shows a face view including a usual erosion goal.

The rejuvenation of refractory metal parts is illustrated in FIGS. 3-6. FIGS. 3-4 show a tantalum (Ta) sputter plate bonded to a copper (Cu) backing plate which may include additional complexity such as bonded-on water cooling coils (CL) or even be part of a large cooling liquid reservoir and/or have complex flanges and mechanical and electrical attaching structures.

E indicates a typical race track form erosion zone arising from sputtering usage.

Figure 5:
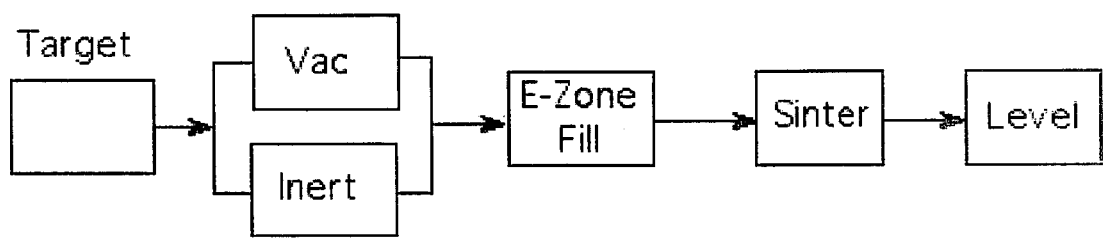
FIG. 5 is a block diagram of the rejuvenation process.

FIG. 5 is a flow chart of implementation of the present invention. A vacuum or inert gas zone is established for a used Ta—Cu target assembly. The erosion zone (E-Zone) is filled with powders of the sputter metal that is bonded by laser or electron beam (EB) raster scanning to melt powder surfaces, but not complete particles. The melting can be done during powder deposition or after deposition on a layer-on-layer basis. A powder derived foil can also be pre-made and laid into the trench.

In all cases the fill is sintered for self bonding and adhesion to target and leveled off by machining, sanding or other abrasion etching and/or a burn-in sputtering process.

Figure 6:
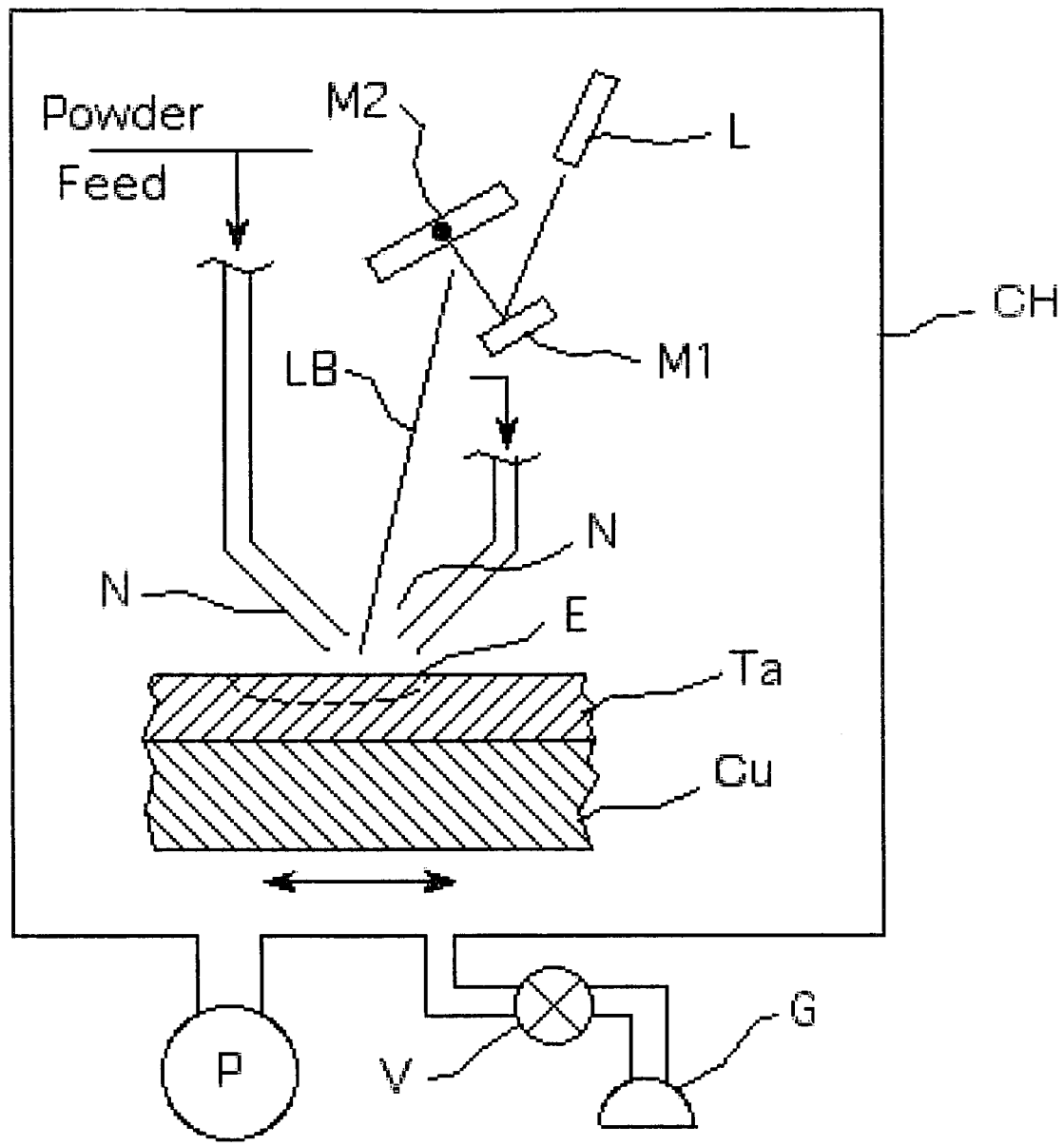
FIG. 6 shows in outline form a vacuum or inert gas chamber set-up for practice of the invention.

The following are several detailed ways of rejuvenating a refractory part. As shown in FIG. 6 such a plate can be placed in a vacuum chamber (VC) evacuated atmospheric pressure purified inert gas (argon) atmosphere utilizing conventional pump P and gas back-fill apparatus G with valving V. A powder feeder comprising multiple nozzles can insert multiple high velocity streams of Ta powder of −100 to 325 mesh to the erosion zone (region). The powder feeder can scan along the erosion zone or the target can be moved relative to a fixed powder feeder. A 15-20 KW (preferably 20-25 laser beam LB formed by a case C and conventional scan optics MI, M2 which can be wholly in the chamber or, partly outside the chamber using a window for beam passage can be traced in raster scan fashion over the erosion zone, as the powder falls, to melt powder particle surfaces and enable particle to particle bonding and bonding to the base of the erosion zone continuously and repeatedly around the zone until it is filled. Powder mass calculations and/or optical monitors can be used to determine completion and a cut-off of filling. The laser can provide post-fill heating to complete the sintering. Separate target heaters can be used to preheat the target or provide additional heat during the rejuvenation.

One form of equipment usable for fabricating and rejuvenating refractory metals is the Lasform brand direct metal deposition system of AeroMet Corp., as described, e.g., in Abbott et al., "Laser Forming Titanium Components" in the May 1998 issue of Advanced Metals & Processes and Arcella et al., "Producing Titanium Aerospace Components From Powder Using Laser Forming," Journal of metals (May 2000), pp. 28-30.

The invention can also be applied to other refractory powder metals, such as Re, W, Mo, W alloy, Mo, alloy, RE alloy, niobium, tantalum alloys, and niobium alloys.

It will now be apparent to those skilled in the art that other embodiments, improvements, details, and uses can be made consistent with the letter and spirit of the forgoing disclosure and within the scope of the invention.

What is claimed is:

1. A process for making a refractory metal part comprising:
   (a) loading refractory powder metal particles into a hopper for feeding into a laser additive chamber, wherein the refractory metal particles are selected from the group consisting of tantalum, Re, W, Mo, W alloys, Mo alloys, Re alloys, niobium, tantalum alloys and niobium alloys.
   (b) loading a substrate into the laser additive chamber,
   (c) feeding the powder metal powders into the additive chamber onto successive points on the substrate in a linear trace,
   (d) melting the substrate and the powder with a laser beam and building up multiple coatings of a controlled microstructure,
   (e) tracing the substrate over a selected area with a combined deposition and melt beam and building up a coating of a controlled microstructure in multiple layers, and
   (f) building up a deposit from the coating and forming a refractory metal part and wherein the refractory metal part is a sputtering target or tube perform or furnace part preform.

2. The process of claim 1, wherein the deposit built up from the coating is a fully dense deposit.

3. The process of claim 1, wherein the process is carried out under inert conditions.

4. The process of claim 3, wherein the conditions include argon, at or near or below atmospheric pressure.

5. The process of claim 1, wherein the process is carried out under a hard vacuum.

6. The process of claim 1, wherein the laser beam generates sufficiently high heat to create conditions that purify the powder and the refractory metal part.

7. The process of claim 1, wherein the refractory metal part is a sputtering target.

8. The process of claim 1, wherein the refractory metal powder particles are tantalum or tantalum alloys.

9. The process of claim 1, wherein the substrate is a tantalum plate.

10. The process of claim 1, wherein the refractory metal part is a sputter plate bonded to a backing plate.

11. The process of claim 1, wherein the sputter plate is a tantalum sputter plate, and the refractory metal particles are tantalum or tantalum alloys.

12. A process for making a refractory metal part comprising:
   (a) loading powder metal particles into a hopper for feeding into a laser additive chamber,
   (b) loading a tantalum substrate into the laser additive chamber,
   (c) feeding the powder metal powders into the additive chamber onto successive points on the substrate in a linear trace,
   (d) melting the substrate and the powder with a laser beam and building up multiple coatings of a controlled microstructure,
   (e) tracing the substrate over a selected area with a combined deposition and melt beam and building up a coating of a controlled micro structure in multiple layers, and
   (f) building up a deposit from the coating and forming a tantalum sputtering target.

13. The process of claim 12, wherein the refractory metal particles are selected from the group consisting of tantalum and tantalum alloys.

* * * * *

UNITED STATES PATENT AND TRADEMARK OFFICE
CERTIFICATE OF CORRECTION

PATENT NO. : 7,651,658 B2 Page 1 of 1
APPLICATION NO. : 10/501837
DATED : January 26, 2010
INVENTOR(S) : Paul R. Aimone et al.

It is certified that error appears in the above-identified patent and that said Letters Patent is hereby corrected as shown below:

On the Title Page, Item (60):

Please add the heading and following

-- Related U.S. Application Data

Provisional Application 60/351,555 filed on January 24, 2002 --.

Signed and Sealed this

Twenty-seventh Day of April, 2010

David J. Kappos
*Director of the United States Patent and Trademark Office*